United States Patent
Wei et al.

(10) Patent No.: US 7,310,402 B2
(45) Date of Patent: Dec. 18, 2007

(54) GATE LINE DRIVERS FOR ACTIVE MATRIX DISPLAYS

(75) Inventors: Chun-Ching Wei, Taipei (TW); Yang-En Wu, Taipei (TW); Wei-Cheng Lin, Wurih Township, Taichung County (TW)

(73) Assignee: AU Optronics Corporation, Hsinchu (TW)

( * ) Notice: Subject to any disclaimer, the term of this patent is extended or adjusted under 35 U.S.C. 154(b) by 172 days.

(21) Appl. No.: 11/302,853

(22) Filed: Dec. 13, 2005

(65) Prior Publication Data

US 2007/0086558 A1  Apr. 19, 2007

Related U.S. Application Data

(60) Provisional application No. 60/727,886, filed on Oct. 18, 2005.

(51) Int. Cl.
  *H03K 5/22* (2006.01)

(52) U.S. Cl. .............................. 377/64; 377/68; 377/79

(58) Field of Classification Search .................. 377/64, 377/68, 70, 71, 78, 79, 80; 345/100
See application file for complete search history.

(56) References Cited

U.S. PATENT DOCUMENTS

| | | | |
|---|---|---|---|
| 5,517,542 A | 5/1996 | Huq | 377/78 |
| 5,859,630 A | 1/1999 | Huq | 345/100 |
| 5,949,398 A * | 9/1999 | Kim | 345/100 |
| 6,747,627 B1 | 6/2004 | Koyama et al. | 345/100 |
| 2004/0046729 A1 | 3/2004 | Moon | 345/100 |
| 2004/0165692 A1* | 8/2004 | Moon et al. | 377/64 |

* cited by examiner

*Primary Examiner*—Tuan T Lam
(74) *Attorney, Agent, or Firm*—Ware, Fressola, Van Der Sluys & Adolphson, LLP

(57) ABSTRACT

A shift register in an amorphous-silicon gate driver comprises a pull-up transistor and two pull-down modules. The pull-up transistor produces a positive pulse when the clock signal is high and the gate of the pull-up transistor is also high. The gate of the pull-up transistor is pulled down to a negative voltage level Vss by two pull-down transistors in the pull-down modules. Each pull-down module also has a further pull-down transistor to keep the output terminal at Vss after the output pulse is produced. The two pull-down modules are operated in a cooperative manner so that each pull-down transistor is conducting approximately 50% of the time. The gates of the pull-down transistors are kept at a positive voltage level approximately 50% of the time and at Vss' approximately 50% of the time with Vss' being more negative than Vss.

20 Claims, 6 Drawing Sheets

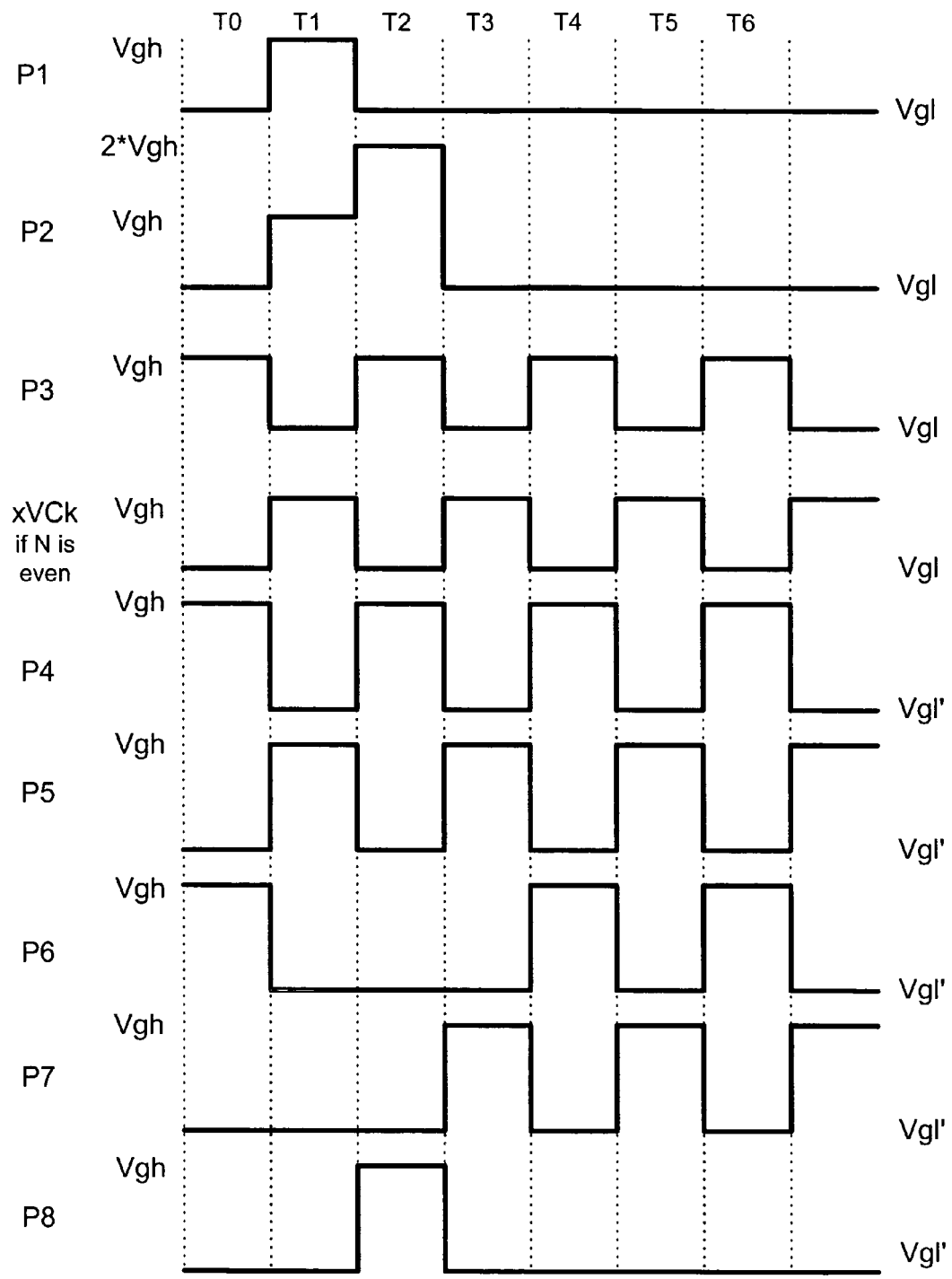
FIG. 7    Vgl=Vss > Vgl'=Vss'

GATE LINE DRIVERS FOR ACTIVE MATRIX DISPLAYS

The present invention is based on and claims priority to U.S. Provisional Application No. 60/727,886, filed Oct. 18, 2005.

TECHNICAL FIELD OF THE INVENTION

The present invention pertains to liquid crystal display (LCD) devices, and more specifically, to electrical circuits for driving the LCD devices.

BACKGROUND OF THE INVENTION

Thin-film transistor liquid-crystal display (TFT-LCD) is a flat-panel display device that displays images by an array of liquid-crystal pixels. As shown in FIG. 1, a typical TFT-LCD display panel 10 comprises a display module 20 having a plurality of pixels 21 arranged in a two-dimensional array. These pixels are controlled by a plurality of data lines D1, D2, . . . , Dn and a plurality of gate lines G1, G2, . . . , Gm. The data lines are connected to a data source driver 30 and the gate lines are connected to a gate line driver 40. A printed circuit board (PCB) 50 containing circuits necessary to convert image data into voltage signals is connected to drivers 30 and 40 via a control bus 52.

In recent years, amorphous silicon gate drivers (ASGDs), which are integrated circuits (ICs) directly fabricated on the same substrate that supports the pixel array, are replacing silicon-chip gate driver ICs for gate line driving of the LCD display. The ASGD technology allows for fewer external components, thus reducing the cost of manufacturing.

As shown in FIG. 2a, an exemplary ASGD gate line driving circuit contains a shift register module 100 that has a plurality of shift registers 110. Each shift register (SR) 110 has an input terminal (In), an output terminal (Out), a voltage source terminal (Vs), a first clock signal terminal (Ck1) and a second clock signal terminal (Ck2). Signals coming from the control bus 52 (see FIG. 1) for gate line driving include a negative voltage Vss, a start pulse signal Vst, a clock signal Vck and a complementary clock signal xVck that has a 180° phase shift relative to the clock signal Vck. Vss is applied to the voltage source terminal Vs of each SR. Vst is applied to the input terminal of the first SR in the SR module. Vck and xVck are applied to clock terminals Ck1 and Ck2, respectively, of each SR in an alternate fashion such that Vck is applied to Ck1 and xVck is applied to Ck2 in every odd-numbered SR, whereas xVck is applied to Ck1 and Vck is applied to Ck2 in every even-numbered SR.

The output terminal of an SR connects to a gate line of the LCD array. Each gate line connects to one row of pixels. A positive output pulse from the SR provides a signal to the gate line in order to energize the pixels in the corresponding row.

The SRs in the SR module are connected in a cascaded manner. When a pulse Vst indicating the beginning of a frame arrives at the first shift register SR001, SR001 provides an output pulse on the first gate line, Gateline001, in correspondence to a clock signal Vck. The same output pulse also arrives at the input terminal of the second shift register SR002 so as to cause SR002 to provide an output pulse on the second gate line, Gateline002, in correspondence to the clock signal xVck. The output pulse from SR002 also arrives at the input terminal of the third shift register SR003 so as to cause SR003 to provide an output pulse on the third gate line, Gateline003, in response to the clock signal Vck. In this manner, every gate line receives a positive pulse in sequence. The odd-numbered SRs are operated in synchronization with the clock signal Vck, whereas the even-numbered SRs are operated in synchronization with the clock signal xVck. A time sequence of Vck, xVck, Vst and SR outputs is shown in FIG. 2b.

In an active-matrix TFT-LCD, the TFT switching element in a pixel only needs to be in an "ON" state (for charging the capacitors that maintain a voltage between the pixel electrodes) for a fraction of time associated with a frame. For the remainder of the time of the frame, it is in an "OFF" state. Thus, in a typical SR for gate line driving, a pull-up TFT is used to provide a short positive pulse at the SR output to turn on the TFT switching element in the pixel. The drain and the gate of the pull-up TFT are usually connected through a capacitor. A pull-down TFT is connected in series to the source of the pull-up TFT to keep the output of the SR in a negative voltage state after the positive pulse is provided. The source terminal of the pull-down TFT is connected to a negative voltage source Vss. Except for the time when the pull-up TFT produces the positive pulse, the gate of the pull-down TFT is maintained at an "ON" state in order to keep the pull-down TFT in a conducting state. At a same time, a TFT is connected to the gate of the pull-up TFT to discharge the capacitor and to keep the gate of the pull-up TFT at the Vss voltage level after the positive pulse is generated and before the input pulse is received.

Jeon et al. (U.S. Pat. No. 6,690,347 B1) and Moon (U.S. Patent Application Publication No. 2004/0046729 A1) disclose a shifter register circuit wherein a pull-down driving section comprising of two TFTs connected in series between a positive voltage source Vdd and a negative voltage source Vss to control the gate voltage of the pull-down TFT. In Jeon et al. and Moon, the input of an SR is connected to the output of a preceding SR. Moon et al. (U.S. Pat. No. 6,845,140 B2) discloses a shift register circuit wherein a carry buffer is used to generate a carry signal for providing a positive pulse to the input of the following SR. In Jeon et al., Moon and Moon et al., when the pull-up TFT is not providing a positive pulse, the gate of the pull-down TFT is maintained at a positive voltage level provided by a positive voltage source Vdd.

It is known in the art that, in ASGDs, the switching threshold of an amorphous-silicon TFT may drift if a constant voltage is applied to the gate terminal for a long period of time. This drift is also known as floating. When the applied voltage to the gate is positive, the threshold drifts higher. When the applied voltage is negative, the threshold drifts lower. The threshold drift may reduce the charge flow in the TFT, affecting its normal operations. For that reason, two complementary pull-down modules are alternately used to provide two complementary pulse signals to the gate of the pull-down TFT, as shown in FIG. 3.

In the $N^{th}$ shift register 110 as shown in FIG. 3, Q2 is the pull-up TFT, and Q1 is for driving Q2. The gate and the drain of Q1 are connected to the input of the SR for receiving a positive pulse from the output of the preceding SR (N-1). The source of the driving TFT Q1 is connected to the gate of Q2. The drain of Q2 is connected to Ck1 for receiving a clock signal. The source terminal of Q2 is connected to the output terminal of the shift register 100 for providing a positive output pulse in response to the input pulse and the clock signal at Ck1. The source of Q2 is also connected to two pull-down TFTs Q3 and Q9 so as to keep the output in a negative voltage state after the output pulse is produced. As shown in FIG. 3, Q9 is in the first pull-down module and Q3 is in the second pull-down module. The gate of Q2 is also connected to two pull-down TFTs Q6 and Q10 so as to keep the gate terminal of Q2 in a negative voltage state after the pulse is generated at the output terminal and before the pulse from the preceding SR is received. As shown in FIG. 3, Q10 is in the first pull-down module and Q6 is in the second pull-down module.

The two pull-down modules are operated in a cooperative manner so that each module carries out the pull-down task approximately 50% of the time. The gates of Q9 and Q10 in the first pull-down module receive clock pulses of 50% duty cycle from a first pulse source, which comprises a pair of TFTs Q12 and Q13 connected in series. The gates of Q3 and Q6 in the second pull-down module receive complementary clock pulses from a second pulse source, which comprises a pair of TFTs Q4 and Q5 connected in series. As shown in FIG. 3, the drain and the gate of Q12 in the first pulse source are connected to Ck1, and the drain and the gate of Q4 in the second pulse source are connected to Ck2. The source terminals of Q13 and Q5 are connected to Vss. The gate of Q13 is connected to Ck2, and the gate of Q5 is connected to Ck1.

The source terminal of Q12 is also connected to a first pulse suppression TFT Q11 to keep the gates of Q9 and Q10 in a negative voltage state, and the source terminal of Q4 is connected to a second pulse suppression TFT Q7 to keep the gates of Q6 and Q3 in a negative voltage state when the output of the SR is high. In addition, the source terminal of Q4 is connected to a third pulse suppression TFT Q8 to keep the gates of Q6 and Q3 in a negative voltage state when the input of the SR is high. The source terminals of Q6, Q7, Q8, Q9, Q10 and Q11 are all connected to Vss at the terminal VS.

The clock signal at Ck1 in the $N^{th}$ SR is Vck if N is odd, and is xVck if N is even. The clock signal at Ck2 is complementary to the clock signal at Ck1 in phase. The relationship of the state of the Vck, xVck is shown in FIG. 4. Thus, when the voltage level at Ck2 is low, the voltage level at the gates of Q9 and Q10 is substantially equal to VH (except when the output of SR is high), and the voltage level at the gates of Q3 and Q6 is substantially equal to Vss. Likewise, when the voltage level at Ck2 is high, the voltage level at the gates of Q9 and Q10 is substantially equal to Vss, and the voltage level at the gates of Q3 and Q6 is substantially equal to VH (except when the input and/or output of the SR is high).

The gates of Q3, Q6, Q9 and Q10 are at VH approximately 50% of the time and at Vss proximately 50% of the time. When the voltage level is high (VH), the threshold drift in the Q3, Q6, Q9 and Q10 increases. When the voltage level is low (Vss), the threshold drift in the Q3, Q6, Q9 and Q10 decreases. If the increase in the threshold drift and the decrease in the threshold drift are equal, then the net threshold drift is substantially zero. The operations of the SR are said to be stable.

However, VH is approximately equal to +18V and Vss is approximately equal to −6V. As a result, the threshold drift in pull-down TFTs Q3, Q6, Q9 and Q10 increases with time. This increase may affect the instability of the pull-down modules and the SR as a whole.

SUMMARY OF THE INVENTION

The present invention provides a method to reduce the operational instability of an amorphous-silicon TFT shift register for driving a gate line in a TFT-LCD display. The shift register comprises a pull-up transistor Q2 and two pull-down modules. The shift register has an input terminal to receive a positive input pulse through the drain and the gate of a driving transistor Q1 and an output terminal to provide a positive output pulse, responsive to the input pulse. The output signal is provided at the source of the pull-up transistor. The gate of the pull-up transistor is connected to the source terminal of the driving transistor and the drain of the pull-up transistor is connected to a clock signal. The pull-up transistor produces a positive pulse when the clock signal is high and the gate of the pull-up transistor is also high. The voltage level at the gate of the pull-up transistor is pulled down to a negative voltage level Vss by two pull-down transistors (Q6, Q10) in the pull-down modules. Each of the pull-down modules also has a pull-down transistor (Q3, Q9) to keep the output terminal at the negative voltage Vss after the output pulse is produced. The two pull-down modules are operated in a cooperative manner so that each of the pull-down transistors (Q3, Q6, Q9, Q10) is conducting approximately 50% of the time. The gates of the pull-down transistors in the pull-down module are kept at a positive voltage level approximately 50% of the time and at a negative voltage level approximately 50% of the time. According to the present invention, the negative voltage level at the gates of the pull-down transistors is more negative than the voltage level Vss.

BRIEF DESCRIPTION OF THE DRAWINGS

FIG. 7 is a timing chart showing the voltage level at various points in the shift register, according to the present invention.

DETAILED DESCRIPTION OF THE INVENTION

Figure 1:
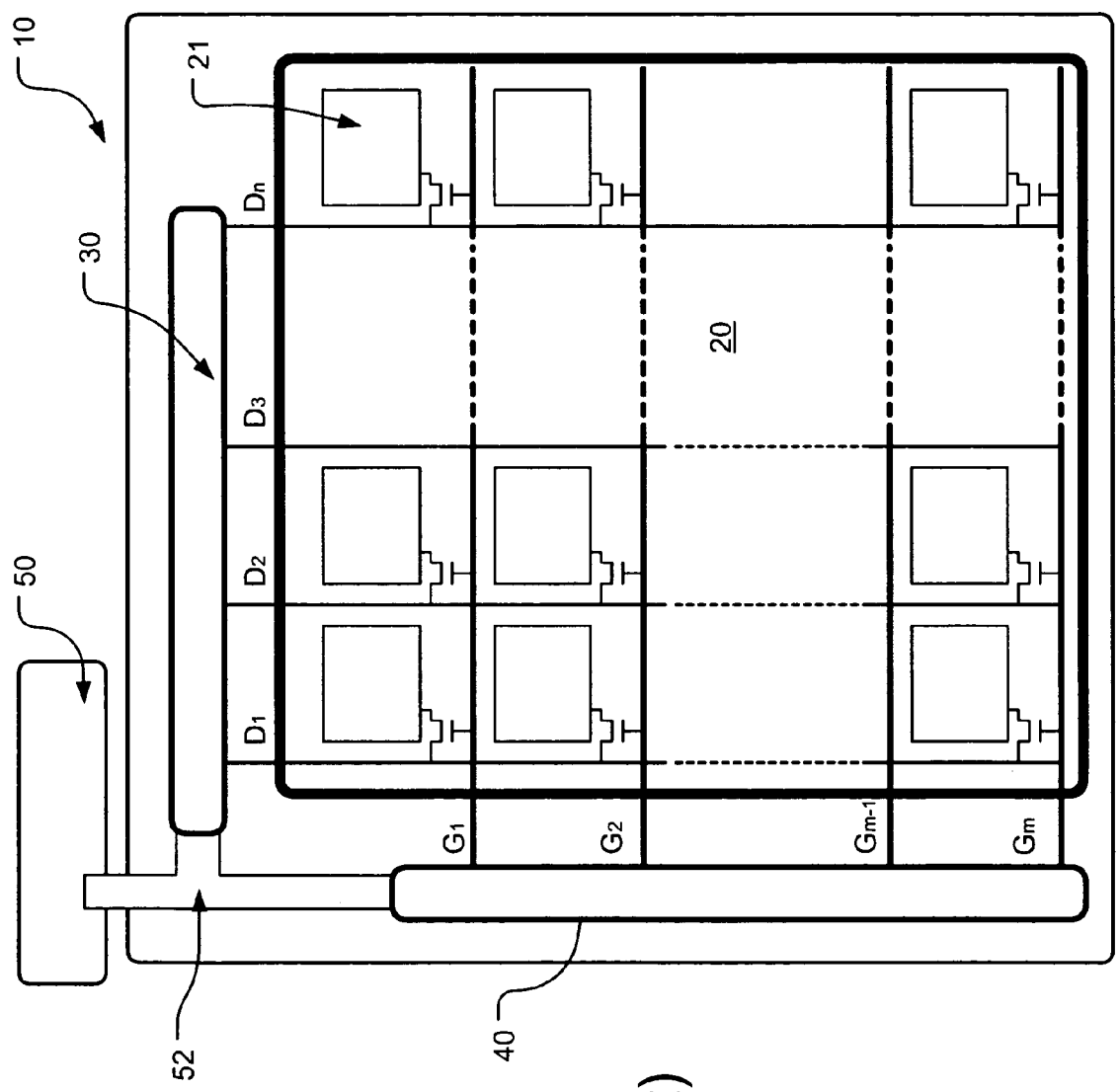
FIG. 1 is a schematic representation of a typical TFT-LCD display device.
Figure 2:
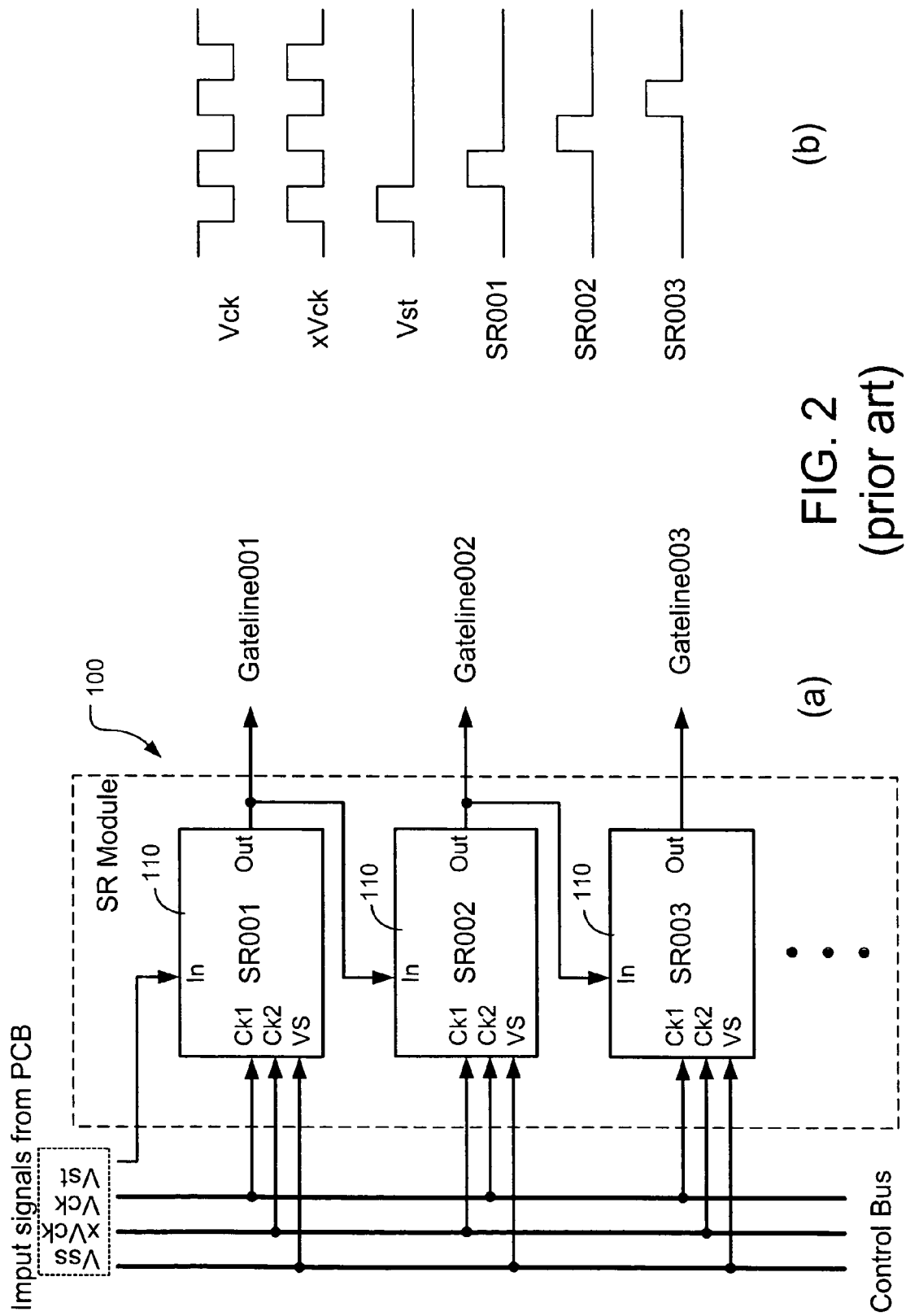
FIG. 2a is a block diagram of a typical shift register module for gate line driving.
FIG. 2b illustrates signal waveforms of Vck, xVck, Vst and shift register outputs.
Figure 3:
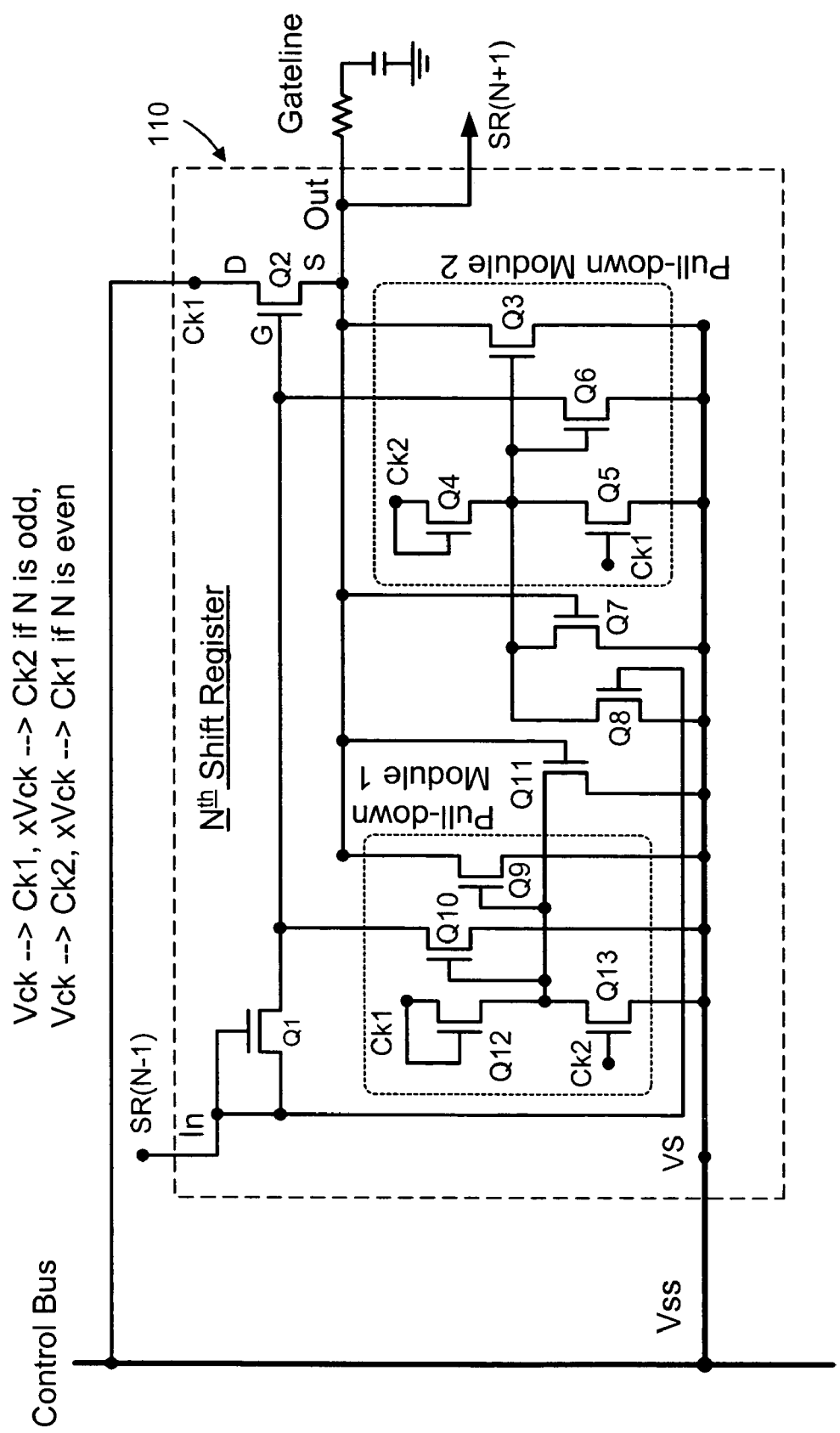
FIG. 3 is a circuit diagram of a prior art shift register.
Figure 5:
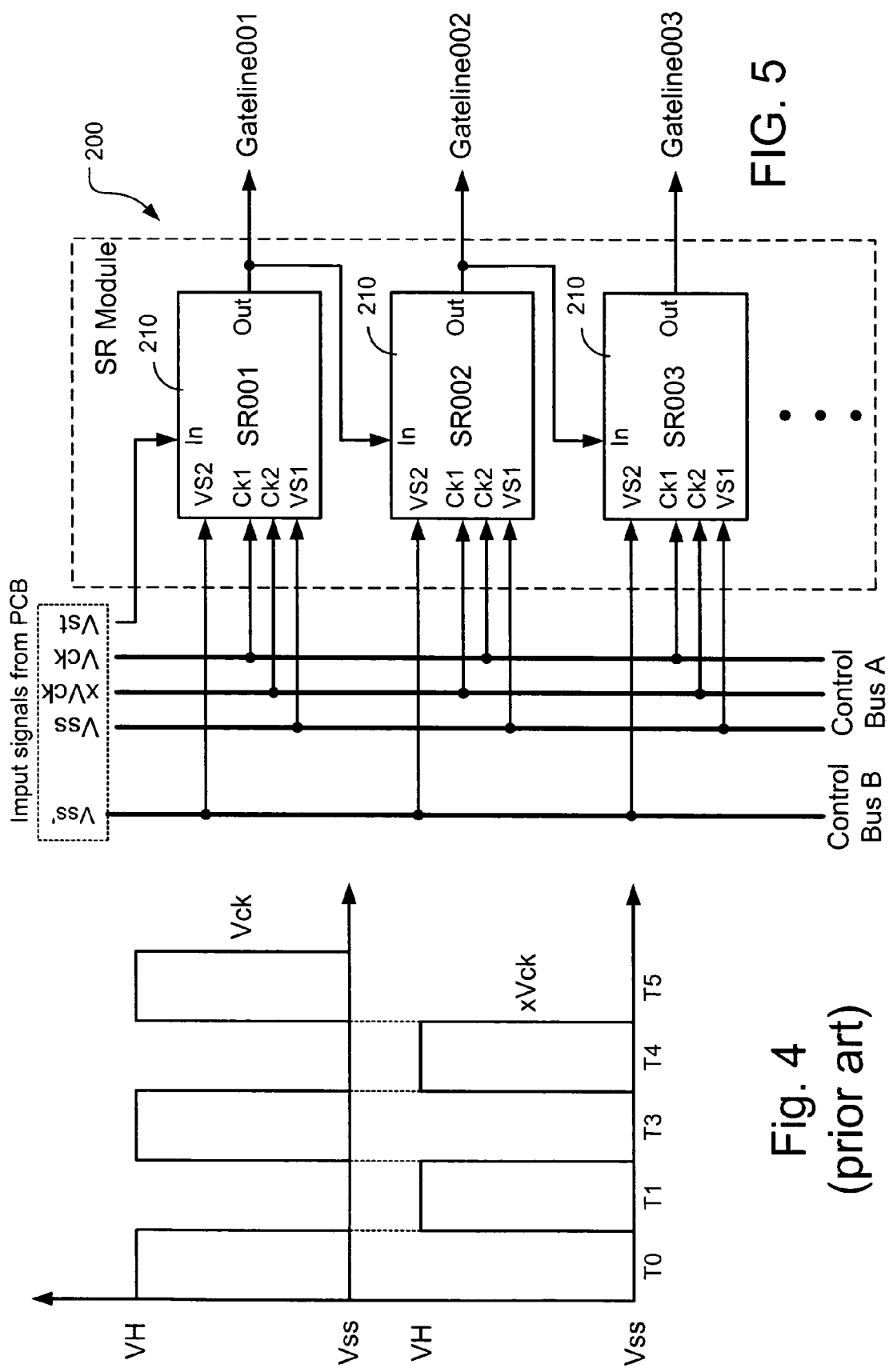
FIG. 5 is a block diagram of a shift register module for gate line driving, according to the present invention.
Figure 4:
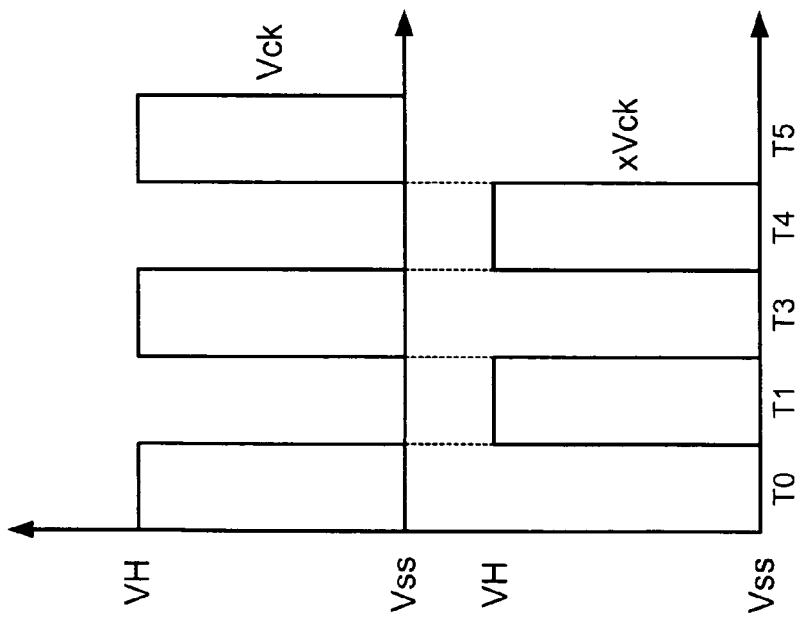
FIG. 4 illustrates waveforms of Vck and xVck with respect to Vss and VH for use in a prior art shift register.
Figure 6:
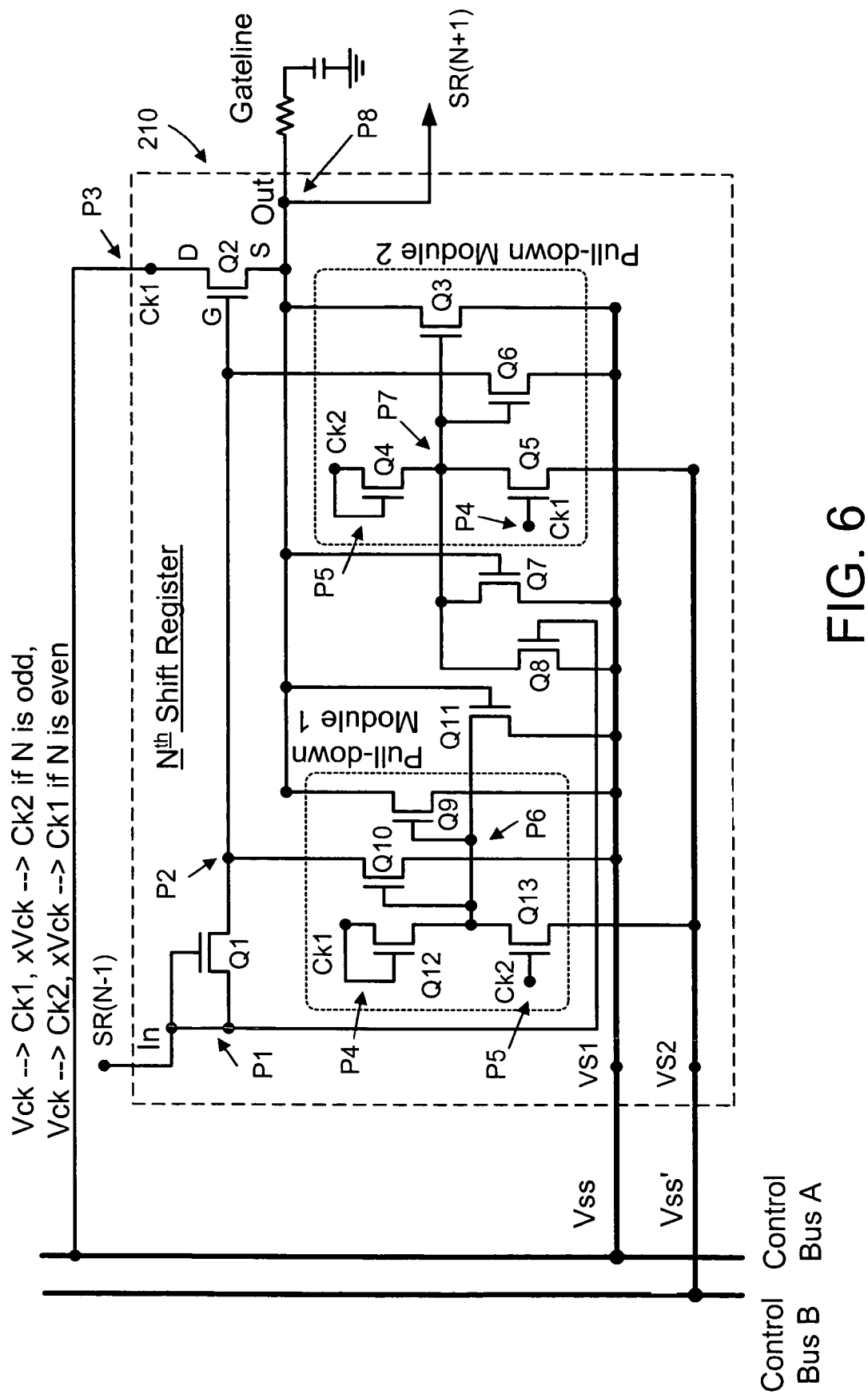
FIG. 6 is a circuit diagram of a shift register, according to the present invention.

The present invention is illustrated in FIGS. 5 and 6. As shown in FIG. 5, an ASGD gate line driving circuit comprises a shift register module 200 connected to control bus A and control bus B. The shift register module 200 comprises a plurality of shift registers 210 connected in a cascaded fashion. Similar to the shift register 110 as shown in FIG. 2a, the shift register 210 has a pull-up TFT, a driving TFT and two pull-down modules.

Referring now to FIG. 6, the $N^{th}$ shift register 210 has a pull-up TFT Q2 and a driving TFT Q1 for driving Q2. The gate and the drain of Q1 are connected to the input of the SR for receiving a positive pulse from the output of the preceding SR (N-1). The source of Q1 is connected to the gate G of Q2. The drain D of Q2 is connected to Ck1 for receiving a clock signal. The source S of Q2 is connected to the output of SR for providing a positive pulse in response to the input pulse and the clock signal. The source of Q2 is also connected to two pull-down TFTs Q3 and Q9 so as to keep the output in a negative voltage state after the output pulse is produced. As shown in FIG. 6, Q9 is in the first pull-down module and Q3 is in the second pull-down module. The gate G of Q2 is also connected to two pull-down TFTs Q6 and Q10 so as to keep the gate terminal of Q2 in a negative voltage state after the pulse is produced at the output terminal and before the pulse from the preceding SR is received. As shown in FIG. 6, Q10 is in the first pull-down module and Q6 is in the second pull-down module.

The gates of Q9 and Q10 in the first pull-down module are connected to a first pulse source, which comprises a pair of TFTs Q12 and Q13 connected in series. The gates of Q3 and Q6 in the second pull-down module are connected to a second pulse source, which comprises a pair of TFTs Q4 and Q5 connected in series. The gates of Q9 and Q10 are also connected to a first pulse suppression TFT Q11 to keep these gates in a negative voltage level when the output of the SR is high. Likewise, the gates of Q3 and Q6 are also connected to a second pulse suppression TFT Q7 to keep these gates in a negative voltage level when the output of the SR is high. In addition, the gates of Q3 and Q6 are connected to a third pulse suppression TFT Q8 to keep these gates in a negative voltage level when the input of the SR is high.

The source terminals of the pull-down TFTs Q3, Q6, Q9 and Q10 are connected to VS1 which is kept at the negative voltage level Vss. The source terminals of pulse suppression TFTs Q7, Q8 and Q11 are connected to VS1, but they can also be connected to VS2.

As shown in FIG. 6, the TFT series (Q12, Q13) in the first pulse source has two ends. The first end is connected to Ck1 and the second end is connected to VS2. The TFT series (Q4, Q5) in the second pulse source has two ends. The first end is connected to Ck2 and the second end is connected to VS2. In contrast to the prior art SR, the voltage level at VS2 is provided at Vss', which is more negative than Vss.

In the TFT series (Q12, Q13), the drain and the gate of Q12 in the first pulse source are connected to Ck1, and the gate of Q13 is connected to Ck2. In the TFT series (Q4, Q5), the drain and the gate of Q4 are connected to Ck2 and the gate of Q5 is connected to Ck1. The clock signal at Ck1 in the $N^{th}$ SR is Vck if N is odd, and is xVck if N is even. The clock signal at Ck2 is complementary to the clock signal at Ck1 in phase.

A timing chart showing the voltage level at different points in the shift register 210 is shown in FIG. 7. In FIG. 7, Vgh is the voltage level of the high state of the clock signals Vck or xVck. Vgl is substantially equal to Vss, and Vgl' is substantially equal to Vss', which is more negative than Vss. Note that the voltage level at point P2 and time duration T2 is higher than Vgh due to the parasitic capacitance associated with the pull-up TFT Q2. As shown in FIGS. 6 and 7, the low voltage level at point P6 in the first pull-down module and point P7 in the second pull-down module is Vgl'. The high voltage level at point P6 in the first pull-down module and point P7 in the second pull-down module is Vgh. As such, the gates of Q3, Q6, Q9 and Q10 are at Vgh approximately 50% of the time and at Vgl' proximately 50% of the time. When the voltage level is at Vgh, the threshold drift in the Q3, Q6, Q9 and Q10 increases. When the voltage level is at Vgl', the threshold drift in Q3, Q6, Q9 and Q10 decreases. Typically Vgl is about +18V. Vgl' (Vss') can be −10V to −15V or even lower. Thus, the discrepancy between the threshold increase and the threshold decrease is much smaller than that in the prior art SR. As such, the net threshold drift in the pull-down TFTs Q3, Q6, Q9 and Q10 over time can be reduced. As a result, the operations of the SR are more stable.

The present invention has been disclosed such that Q1-Q13 in each shift register 210 are described as a thin-film transistor (TFT) in shift register module 200 in an amorphous silicon gate driver (ASGD). It should be understood by those skilled in the art that the shift register module can be used in a gate driver made of a different material but with similar drift problems associated with switching threshold, and each TFT can be replaced by a switching element having two switching ends and a control end. Thus, the present invention can be summarized to include:

A gateline driving circuit (100) adapted to receive a first clock signal, a second clock signal, a start signal source, a first negative voltage level from a first voltage source, a second negative voltage level from a second voltage source, wherein the second negative voltage level is more negative than the first negative voltage level, and the first clock signal is complementary in phase to the second clock signal. The driving circuit comprises:

a plurality of odd-numbered shift registers, and a plurality of even-numbered shift registers, each shift register having an input terminal (In), a first clock input, a second clock input and an output terminal (Out), wherein the odd-numbered shifter registers include a first odd-numbered shifter register and a plurality of subsequent odd-numbered shift registers, and wherein the odd-numbered and even-numbered shift registers are connected in a cascaded manner such that the first clock input of each odd-numbered shift register and the second clock input of each even-numbered register are adapted to receive the first clock signal;

the second clock input of each odd-numbered shift register and the first clock input of each even-numbered register are adapted to receive the second clock signal;

the input terminal of the first odd-numbered shift register is operatively connected to the start signal source for receiving therefrom an input pulse;

the input terminal of each of the even-numbered shifter registers is operatively connected to the output terminal of a preceding odd-numbered shifter register for receiving therefrom an input pulse; and the input terminal of each of the subsequent odd-numbered shifter registers is operatively connected to the output terminal of a preceding even-numbered shift register for receiving therefrom an input pulse.

Each of the shift registers, according to the present invention, comprises:

(I) a pull-up section (Q2) having an input end (D) adapted to receive the first clock signal, a control end (G) adapted to receive the input pulse, and an output end (S) to provide the output pulse in response to the input pulse and the first clock signal;

(II) a first pull-down module including:

a first pulse source (Q4, Q5) adapted to receive the first clock signal, a second clock signal complementary to the first clock signal, and the second negative voltage level, a first output pull-down section (Q3) operatively connected to the first pulse source and the first voltage source, and a first control-end pull-down section (Q6) operatively connected to the first pulse source and the first voltage source; and (III) a second pull-down module including:

a second pulse source (Q12, Q13) adapted to receive the first clock signal, the second clock signal and the second negative voltage level, a second output pull-down section (Q9) operatively connected to the second pulse source and the first voltage source, wherein the first and second output pull-down sections are operated in a cooperative fashion such that a voltage level at the output end of the pull-up section is alternately pulled down to the first negative level in an output pull-down period, and a second control-end pull-down section (Q10) operatively connected to the second pulse source and the first voltage source, wherein the first and second control-end pull-down sections are operated in a cooperative fashion such that a voltage level at the control end of the pull-up section is alternately pulled down to the first negative level in a control-end pull-down period, wherein the first output pull-down section (Q3) comprises a switching element having:
  a first switching end connected to the output end of the pull-up section,
  a second switching end connected to the first voltage source, and
  a first control end connected to the first pulse source;

the second output pull-down section (Q9) comprises a switching element having:
  a first switching end connected to the output-end of the pull-up section,
  a second switching end connected to the first voltage source, and
  a second control end connected to the first pulse source, so as to allow the first pulse source to pull down a voltage level at the first control end and a voltage level at the second control end to the second negative voltage level in a complementary way during the output pull-down period;

the first control-end pull-down section (Q6) comprises a switching element having:
  a first switching end connected to the control end of the pull-up section,
  a second switching end connected to the first voltage source, and
  a first control end connected to the first pulse source; and the second control-end pull-down section (Q10) comprises a switching element having:
  a first switching end connected to the control end of the pull-up section,
  a second switching end connected to the first voltage source, and
  a second control end connected to the first pulse source, so as to allow the first pulse source to pull down a voltage level at the first control end and a voltage level at the second control end to the second negative voltage level in a complementary way during the control-end pull-down period.

Moreover, each shift register further comprises:

(IV) a further switching element (Q7) having:
  a first switching end connected to the first control-end of the first output pull-down section (Q3) and the first control-end of the first control-end pull-down section (Q6),
  a second switching end connected to the first voltage source, and
  a control end connected to the output end of the pull-up section so as to pull down the voltage level at the first control end of the first output pull-down section and the voltage level at the first control end of the first control-end pull-down section to the first voltage level when the output pulse is provided;

(V) another switching element (Q11) having:
  a first switching end connected to the second control end of the second output pull-down section (Q9) and the second control end of the second control-end pull-down section (Q10),
  a second switching end connected to the first voltage source, and
  a control end connected to the output end of the pull-up section so as to pull down the voltage level at the second control end of the second output pull-down section, and the voltage level at the second control end of the second control-end pull-down section to the first voltage level when the output pulse is provided; and (VI) a pulse-suppression switching element (Q8) having:
  a first switching end connected to the first control end of the first output pull-down section (Q3),
  a second switching end connected to the first voltage source, and
  a control end connected to the input terminal, so as to pull down the voltage level at the first control end of the first output pull-down section to the first voltage level when the input pulse is received.

Although the invention has been described with respect to one or more embodiments thereof, it will be understood by those skilled in the art that the foregoing and various other changes, omissions and deviations in the form and detail thereof may be made without departing from the scope of this invention.

What is claimed is:

1. A shift register circuit adapted to receive a first negative voltage level from a first voltage source, a second negative voltage level form a second voltage source, and a first clock signal, wherein the second negative voltage level is more negative than the first negative voltage level, the circuit comprising:
  an input terminal to receive an input pulse;
  an output terminal to provide an output pulse;
  a pull-up section having:
    an input end adapted to receive the first clock signal,
    a control end adapted to receive the input pulse, and
    an output end to provide the output pulse in response to the input pulse and the first clock signal;
  a first pull-down module including:
    a first pulse source adapted to receive the first clock signal, a second clock signal complementary to the first clock signal, and the second negative voltage level,
    a first output pull-down section operatively connected to the first pulse source and the first voltage source, and
    a first control-end pull-down section operatively connected to the first pulse source and the first voltage source; and
  a second pull-down module including:
    a second pulse source adapted to receive the first clock signal, the second clock signal and the second negative voltage level,
    a second output pull-down section operatively connected to the second pulse source and the first voltage source, wherein the first and second output pull-down sections are operated in a cooperative fashion such that a voltage level at the output end of the pull-up section is alternately pulled down to the first negative level in an output pull-down period, and
    a second control-end pull-down section operatively connected to the second pulse source and the first voltage source, wherein the first and second control-end pull-down sections are operated in a cooperative fashion such that a voltage level at the control end of the pull-up section is alternately pulled down to the first negative level in a control-end pull-down period.

2. The shift register circuit of claim 1, wherein
the first output pull-down section comprises a switching element having:
  a first switching end connected to the output end of the pull-up section,
  a second switching end connected to the first voltage source, and
  a first control end connected to the first pulse source; and
the second output pull-down section comprises a switching element having:
  a first switching end connected to the output-end of the pull-up section,
  a second switching end connected to the first voltage source, and
  a second control end connected to the second pulse source, so as to allow the first pulse source to pull down a voltage level at the first control end and a voltage level at the second control end to the second negative voltage level in a complementary fashion during the output pull-down period.

3. The shift register circuit of claim 1, wherein
the first control-end pull-down section comprises a switching element having:
  a first switching end connected to the control end of the pull-up section,
  a second switching end connected to the first voltage source, and
  a first control end connected to the first pulse source; and
the second control-end pull-down section comprises a switching element having:
  a first switching end connected to the control end of the pull-up section,
  a second switching end connected to the first voltage source, and
  a second control end connected to the second pulse source, so as to allow the first pulse source to pull down a voltage level at the first control end and a voltage level at the second control end to the second negative voltage level in a complementary fashion during the control-end pull-down period.

4. The shift register circuit of claim 2, further comprising a further switching element having:
  a first switching end connected to the first control end of the first output pull-down section,
  a second switching end connected to the first voltage source, and
  a control end connected to the output end of the pull-up section so as to pull down the voltage level at the first control end of the first output pull-down section to the first voltage level when the output pulse is provided.

5. The shift register circuit of claim 2, further comprising a further switching element having:
  a first switching end connected to the second control end of the second output pull-down section,
  a second switching end connected to the first voltage source, and
  a control end connected to the output end of the pull-up section so as to pull down the voltage level at the second control end of the second output pull-down section to the first voltage level when the output pulse is provided.

6. The shift register circuit of claim 3, further comprising a further switching element having:
  a first switching end connected to the first control end of the first control-end pull-down section,
  a second switching end connected to the first voltage source, and
  a control end connected to the output end of the pull-up section so as to pull down the voltage level at the first control end of the first control-end pull-down section to the first voltage level when the output pulse is provided.

7. The shift register circuit of claim 3, further comprising a further switching element having:
  a first switching end connected to the second control end of the second control-end pull-down section,
  a second switching end connected to the first voltage source, and
  a control end connected to the output end of the pull-up section so as to pull down the voltage level at the second control end of the second control-end pull-down section to the first voltage level when the output pulse is provided.

8. The shift register circuit of claim 4 further comprising a pulse-suppression switching element having:
  a first switching end connected to the first control end of the first output pull-down section,
  a second switching end connected to the first voltage source, and
  a control end connected to the input terminal, so as to pull down the voltage level at the first control end of the first output pull-down section to the first voltage level when the input pulse is received.

9. The shift register circuit of claim 1, further comprising a driving switching element having:
  a control end connected to the input terminal,
  a first switching end connected to the control end, and
  a second switching end connected to the control end of the pull-up section.

10. The shift register circuit of claim 1, wherein
the first output pull-down section comprises a switching element having:
  a first switching end connected to the output end of the pull-up section,
  a second switching end connected to the first voltage source, and
  a first control end connected to the first pulse source;
the second output pull-down section comprises a switching element having:
  a first switching end connected to the output-end of the pull-up section,
  a second switching end connected to the first voltage source, and
  a second control end connected to the second pulse source, so as to allow the first pulse source to pull down a voltage level at the first control end and a voltage level at the second control end to the second negative voltage level in a complementary way during the output pull-down period;
the first control-end pull-down section comprises a switching element having:
  a first switching end connected to the control end of the pull-up section,
  a second switching end connected to the first voltage source, and a first control end connected to the first pulse source; and the second control-end pull-down section comprises a switching element having:
- a first switching end to the control end of the pull-up section,
- a second switching end connected to the second voltage source, and
- a second control end connected to the first pulse source, so as to allow the first pulse source to pull down a voltage level at the first control end and a voltage level at the second control end to the second negative voltage level in a complementary way during the control-end pull-down period.

11. The shift register circuit of claim 10, further comprising
- a further switching element having:
  - a first switching end connected to the first control-end of the first output pull-down section and the first control-end of the first control-end pull-down section,
  - a second switching end connected to the first voltage source, and
  - a control end connected to the output end of the pull-up section so as to pull down the voltage level at the first control end of the first output pull-down section and the voltage level at the first control end of the first control-end pull-down section to the first voltage level when the output pulse is provided.

12. The shift register circuit of claim 10, further comprising
- a further switching element having:
  - a first switching end connected to the second control end of the second output pull-down section and the second control end of the second control-end pull-down section,
  - a second switching end connected to the first voltage source, and
  - a control end connected to the output end of the pull-up section so as to pull down the voltage level at the second control end of the second output pull-down section, and the voltage level at the second control end of the second control-end pull-down section to the first voltage level when the output pulse is provided.

13. The shift register circuit of claim 11, further comprising
- another switching element having:
  - a first switching end connected to the second control end of the second output pull-down section and the second control end of the second control-end pull-down section,
  - a second switching end connected to the first voltage source, and
  - a control end connected to the output end of the pull-up section so as to pull down the voltage level at the second control end of the second output pull-down section, and the voltage level at the second control end of the second control-end pull-down section to the first voltage level when the output pulse is provided.

14. The shift register circuit of claim 13 further comprising
- a pulse-suppression switching element having:
  - a first switching end connected to the first control end of the first output pull-down section,
  - a second switching end connected to the first voltage source, and
  - a control end connected to the input terminal, so as to pull down the voltage level at the first control end of the first output pull-down section to the first voltage level when the input pulse is received.

15. A gateline driving circuit adapted to receive a first clock signal, a second clock signal, a start signal source, a first negative voltage level from a first voltage source, a second negative voltage level from a second voltage source, wherein the second negative voltage level is more negative than the first negative voltage level, and the first clock signal is complementary in phase to the second clock signal, said driving circuit comprising:
- a plurality of odd-numbered shift registers, and
- a plurality of even-numbered shift registers, each shift register having an input terminal, a first clock input, a second clock input and an output terminal, wherein the odd-numbered shifter registers include a first odd-numbered shifter register and a plurality of subsequent odd-numbered shift registers, and wherein the odd-numbered and even-numbered shift registers are connected in a cascaded manner such that
- the first clock input of each odd-numbered shift register and the second clock input of each even-numbered register are adapted to receive the first clock signal;
- the second clock input of each odd-numbered shift register and the first clock input of each even-numbered register are adapted to receive the second clock signal;
- the input terminal of the first odd-numbered shift register is operatively connected to the start signal source for receiving therefrom an input pulse;
- the input terminal of each of the even-numbered shifter registers is operatively connected to the output terminal of a preceding odd-numbered shifter register for receiving therefrom an input pulse; and
- the input terminal of each of the subsequent odd-numbered shifter registers is operatively connected to the output terminal of a preceding even-numbered shift register for receiving therefrom an input pulse, each shift register comprising:
- a pull-up section having
  - an input end adapted to receive the first clock signal,
  - a control end adapted to receive the input pulse, and
  - an output end to provide the output pulse in response to the input pulse and the first clock signal;
- a first pull-down module including:
  - a first pulse source adapted to receive the first clock signal, a second clock signal complementary to the first clock signal, and the second negative voltage level,
  - a first output pull-down section operatively connected to the first pulse source and the first voltage source, and
  - a first control-end pull-down section operatively connected to the first pulse source and the first voltage source; and
- a second pull-down module including:
  - a second pulse source adapted to receive the first clock signal, the second clock signal and the second negative voltage level,
  - a second output pull-down section operatively connected to the second pulse source and the first voltage source, wherein the first and second output pull-down sections are operated in a cooperative fashion such that a voltage level at the output end of the pull-up section is alternately pulled down to the first negative level in an output pull-down period, and a second control-end pull-down section operatively connected to the second pulse source and the first voltage source, wherein the first and second control-end pull-down sections are operated in a cooperative fashion such that a voltage level at the control end of the pull-up section is alternately pulled down to the first negative level in a control-end pull-down period.

16. The gateline driver circuit of claim 15, wherein
the first output pull-down section comprises a switching element having:
   a first switching end connected to the output end of the pull-up section,
   a second switching end connected to the first voltage source, and
   a first control end connected to the first pulse source;
the second output pull-down section comprises a switching element having:
   a first switching end connected to the output-end of the pull-up section,
   a second switching end connected to the first voltage source, and
   a second control end connected to the second pulse source, so as to allow the first pulse source to pull down a voltage level at the first control end and a voltage level at the second control end to the second negative voltage level in a complementary way during the output pull-down period;
the first control-end pull-down section comprises a switching element having:
   a first switching end connected to the control end of the pull-up section,
   a second switching end connected to the first voltage source, and
   a first control end connected to the first pulse source; and
the second control-end pull-down section comprises a switching element having:
   a first switching end connected to the control end of the pull-up section,
   a second switching end connected to the first voltage source, and
   a second control end connected to the second pulse source, so as to allow the first pulse source to pull down a voltage level at the first control end and a voltage level at the second control end to the second negative voltage level in a complementary way during the control-end pull-down period.

17. The gateline driver circuit of claim 16, wherein each shift register further comprises
a further switching element having:
   a first switching end connected to the first control-end of the first output pull-down section and the first control-end of the first control-end pull-down section,
   a second switching end connected to the first voltage source, and
   a control end connected to the output end of the pull-up section so as to pull down the voltage level at the first control end of the first output pull-down section and the voltage level at the first control end of the first control-end pull-down section to the first voltage level when the output pulse is provided.

18. The gateline driver circuit of claim 17, wherein each shift register further comprises
another switching element having:
   a first switching end connected to the second control end of the second output pull-down section and the second control end of the second control-end pull-down section,
   a second switching end connected to the first voltage source, and
   a control end connected to the output end of the pull-up section so as to pull down the voltage level at the second control end of the second output pull-down section, and
the voltage level at the second control end of the second control-end pull-down section to the first voltage level when the output pulse is provided.

19. The gateline driver circuit of claim 18, wherein each shift register further comprises
a pulse-suppression switching element having:
   a first switching end connected to the first control end of the first output pull-down section,
   a second switching end connected to the first voltage source, and
   a control end connected to the input terminal, so as to pull down the voltage level at the first control end of the first output pull-down section to the first voltage level when the input pulse is received.

20. A method to reduce operational instability of an amorphous-silicon TFT shift register for driving a gate line in a TFT-LCD display, the shift register comprising
an input terminal for receiving an input pulse;
a clock input terminal for receiving a clock signal;
an output terminal for providing an output pulse in response to the input pulse and the clock signal;
a pull-up transistor having a drain operatively connected to the clock input terminal for receiving the clock pulse, a gate operatively to the input terminal for receiving the input pulse, and a source operatively connected to the output terminal for providing the output pulse when the clock signal is high and the gate of the pull-up transistor is also high;
a first pull-down module and a second pull-down module, each module having a first pull-down transistor operatively connected to the gate of the pull-up transistor and a second pull-down transistor operatively connected to the source of the pull-up transistor, each pull-down transistor having a gate terminal;
a first pulse source operatively connected to the gate terminals of the first and second pull-down transistors in the first pull-down module; and
a second pulse source operatively connected to the gate terminals of first and second pull-down transistors in the second pull-down module, wherein the first and second pulse sources are operated in a cooperative fashion such that each of the pull-down transistors is substantially turned on and off alternately for pulling down a voltage level at the gate and the source of the pull-up transistor, said method comprising the steps of:
connecting a first negative voltage source to the pull-down transistors so that the voltage level at the gate and the source of the pull-up transistor is pulled-down to a first negative voltage level; and
connecting a second negative voltage source to the first and second pulse sources so that a voltage level at the gates of the pull-down transistors is pull-down to a second negative voltage level when the pull-down transistors are turned off, wherein the second negative voltage level is more negative than the first negative voltage level.

* * * * *

UNITED STATES PATENT AND TRADEMARK OFFICE
CERTIFICATE OF CORRECTION

PATENT NO.       : 7,310,402 B2                                             Page 1 of 1
APPLICATION NO.  : 11/302853
DATED            : December 18, 2007
INVENTOR(S)      : Wei et al.

It is certified that error appears in the above-identified patent and that said Letters Patent is hereby corrected as shown below:

In column 11, line 7, claim 10, line 33, "second" should be --first--.

In column 11, line 9, claim 10, line 35, "first" should be --second--.

Signed and Sealed this

Twenty-seventh Day of May, 2008

JON W. DUDAS
*Director of the United States Patent and Trademark Office*